(12) United States Patent
Kao

(10) Patent No.: US 10,775,703 B2
(45) Date of Patent: Sep. 15, 2020

(54) EXPOSURE SYSTEM AND METHOD FOR MANUFACTURING DISPLAY PANEL USING THE SAME

(71) Applicant: InnoLux Corporation, Miao-Li County (TW)

(72) Inventor: Chen-Kuan Kao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/212,909

(22) Filed: Dec. 7, 2018

(65) Prior Publication Data

US 2019/0204751 A1 Jul. 4, 2019

(30) Foreign Application Priority Data

Jan. 3, 2018 (CN) .......................... 2018 1 0004701

(51) Int. Cl.
*G03F 7/20* (2006.01)
*G02F 1/1337* (2006.01)
*G02F 1/13* (2006.01)
*B65G 49/06* (2006.01)

(52) U.S. Cl.
CPC ....... *G03F 7/70191* (2013.01); *B65G 49/067* (2013.01); *G02F 1/1303* (2013.01); *G02F 1/133788* (2013.01); *G03F 7/201* (2013.01); *B65G 49/064* (2013.01)

(58) Field of Classification Search
CPC ............. G02F 1/1303; G02F 1/133788; G03F 7/70191; G03F 7/00; B65G 49/06; B65G 49/063
See application file for complete search history.

(56) References Cited

U.S. PATENT DOCUMENTS

| | | | | |
|---|---|---|---|---|
| 6,414,751 B1 * | 7/2002 | Kurogama | ............. | G01N 21/55 356/237.1 |
| 2006/0289794 A1 * | 12/2006 | Furukawa | ........... | G03F 7/70341 250/492.1 |
| 2007/0014112 A1 * | 1/2007 | Ohya | .................. | G03F 7/70191 362/268 |
| 2008/0186467 A1 * | 8/2008 | Hembacher | ......... | G03F 7/70341 355/67 |
| 2014/0368748 A1 * | 12/2014 | Kao | ........................ | G03F 7/201 349/4 |

(Continued)

*Primary Examiner* — Deoram Persaud
(74) *Attorney, Agent, or Firm* — Muncy, Geissler, Olds & Lowe, P.C.

(57) ABSTRACT

A method for manufacturing a display panel includes: providing a first substrate and an exposure system, wherein the exposure system includes a light source module and a first shielding unit; disposing the first shielding unit at a position between the first substrate and the light source module in the initial state; moving the first shielding unit along a first direction; moving the light source module to pass through the first shielding unit along a second direction different from the first direction, and exposing the first substrate to the light emitted by the light source module; moving the light source module along the opposite direction of the second direction; and moving the first shielding unit back to the position between the first substrate and the light source module along the opposite direction of the first direction.

20 Claims, 16 Drawing Sheets

(56) References Cited

U.S. PATENT DOCUMENTS

2015/0064737 A1*  3/2015  Moriwaki .............. G01N 21/47
                                                            435/29
2015/0124236 A1*  5/2015  Lin ....................... G02F 1/1303
                                                            355/77
2019/0244844 A1*  8/2019  Takeda ....................... G03F 1/84

* cited by examiner

EXPOSURE SYSTEM AND METHOD FOR MANUFACTURING DISPLAY PANEL USING THE SAME

CROSS REFERENCE TO RELATED APPLICATION

This application claims the benefits of the Chinese Patent Application Serial Number 201810004701.0, filed on Jan. 3, 2018, the subject matter of which is incorporated herein by reference.

BACKGROUND OF THE INVENTION

1. Field

The present disclosure relates to a method for manufacturing a display panel and more particularly to a method for exposing a substrate to light using a specially designed exposure system.

2. Description of Related Art

Typically, the manufacture of a display panel entails exposing a substrate to the light of a light source module in order to form a patterned structure or create an alignment layer for aligning liquid crystals. However, neither at the start of the exposure (when the light source module is moving in the turned-on state to a predetermined position above the substrate to emit light on the substrate) nor at the end of the exposure (when the light source module is moving away from the predetermined position, in the turned-on state, to stop emitting light on the substrate) are the leading-edge region and the trailing-edge region of the substrate exposed to the same amount of light, and this has adverse effect on the display quality of the finished display panel. For example, the liquid crystals of the display panel may have different pretilt angles such that the brightness of the display panel varies from one area to another.

Besides, given the limited space in a display panel factory, it is generally desired to minimize the footprint of each machine to be used in the factory so that more machines can be installed. One common practice to downsize an exposure system is to shorten the distance between the light source module and the substrate carrier, but if the light source module is too close to the carrier, unnecessary exposure will take place and lower the display quality of the finished products.

It is therefore imperative to develop a method and exposure system for manufacturing a display panel, which can reduce the difference in exposure period, or in the amount of light exposure, between two opposite edge regions of the substrate of the display panel so as to enhance the display quality of the display panel.

SUMMARY

In view of the above, the present disclosure utilizes a specially designed exposure system and provides a method for manufacturing a display panel, the objective being to minimize the difference in exposure period, or in the amount of light exposure, between two opposite edge regions of a substrate so that the resulting display panel has high display quality.

To achieve the foregoing objective, the present disclosure provides a method for manufacturing a display panel, wherein the method includes the steps of: providing a first substrate and an exposure system, wherein the exposure system includes a light source module and a first shielding unit; disposing the first shielding unit at a position between the first substrate and the light source module in the initial state; moving the first shielding unit along a first direction; moving the light source module to pass through the first shielding unit along a second direction different from the first direction, and exposing the first substrate to the light emitted by the light source module; moving the light source module along the opposite direction of the second direction; and moving the first shielding unit back to the position between the first substrate and the light source module along the opposite direction of the first direction.

The present disclosure further provides an exposure system that includes: a first carrier with a surface, wherein a reference plane is parallel to the surface and has a normal direction; a light source module adjacent to the first carrier; and a first shielding unit disposed between the first carrier and the light source module. In the initial state, the first carrier has a first projection on the reference plane, and the light source module has a second projection on the reference plane. The first projection and the second projection are both projected along the normal direction of the reference plane but do not overlap.

BRIEF DESCRIPTION OF THE DRAWINGS

FIG. 5 shows the light source module in certain embodiments of the present disclosure; and.

DETAILED DESCRIPTION OF THE PREFERRED EMBODIMENT

Specific embodiments are described below to demonstrate how to implement the present disclosure. Based on the contents disclosed herein, a person skilled in the art can easily understand other advantages and effects of the present disclosure. The disclosed embodiments can be used freely in combination with one another without departing from the spirit of the present disclosure. Also, the present disclosure can be implemented or applied in ways different from those demonstrated by the embodiments. All the details in the specification can be modified or changed to meet different points of view or applications without departing from the spirit of the present creation.

Furthermore, the ordinal numbers used in the specification and the appended claims such as "first", "second", "third", and "fourth" serve only to modify the claimed elements immediately after them and do not imply that such a claimed element has a counterpart with a previous or subsequent ordinal number, that there is a certain order between such claimed elements, or that such claimed elements are sequentially used in a manufacturing process. The ordinal numbers are used only to provide a clear distinction between claimed elements having the same name.

In addition, the term "on", "above" or "over" as used in the specification and the claims to refer to the position of one element in relation to another may refer to direct or indirect contact between the two elements.

Embodiment 1

Figure 1A:
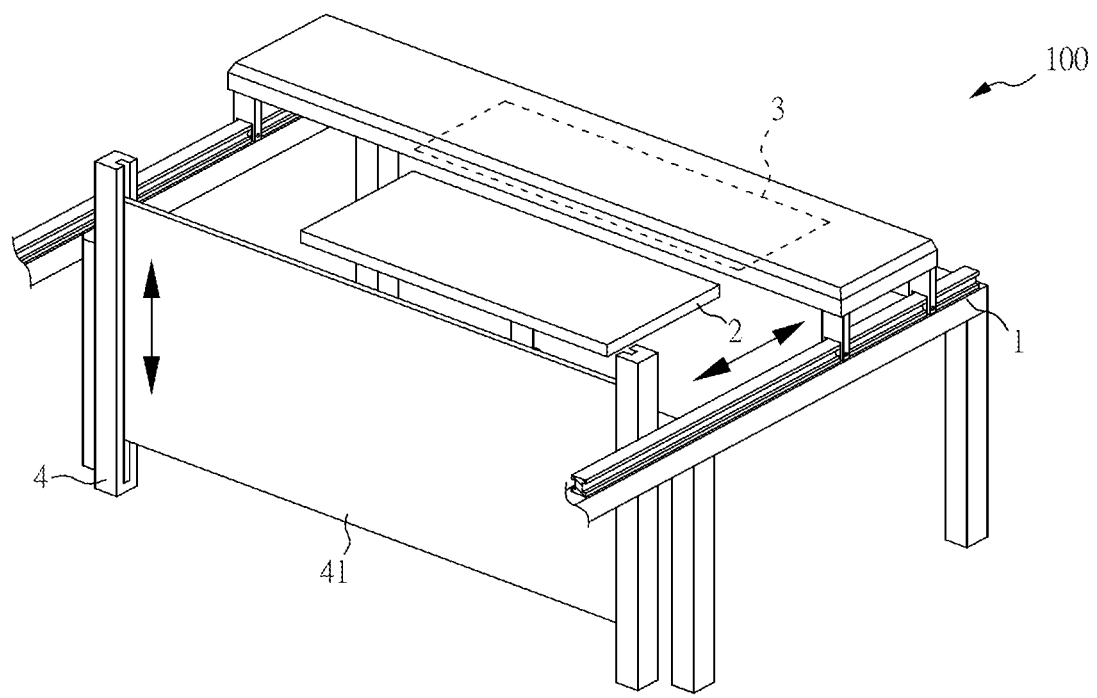
FIG. 1A is a perspective view of an exposure system according to the first embodiment of the present disclosure.
Figure 1B:
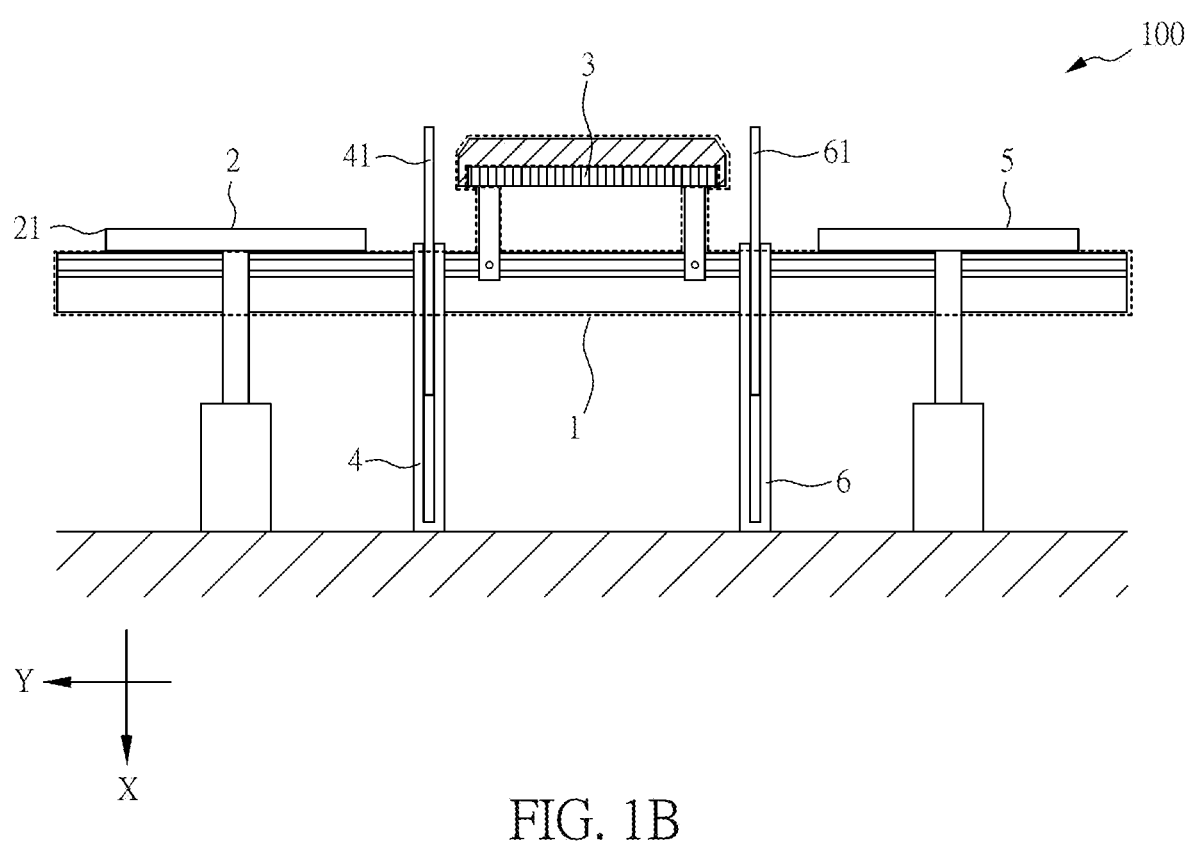
FIG. 1B is a sectional view of another exposure system according to the first embodiment of the present disclosure.
Figure 1C:
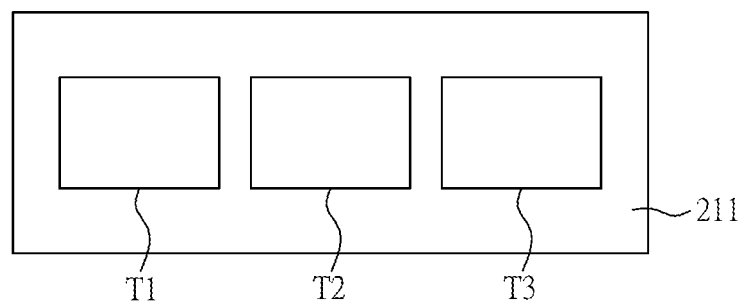
FIG. 1C is a schematic top view of the exposure system in FIG. 1B.

Please refer to FIG. 1A to FIG. 1C. FIG. 1A shows a state in which an exposure system according to the first embodiment of the present disclosure is in operation. FIG. 1B is a sectional view of a similar exposure system according to the first embodiment of the present disclosure. As shown in FIG. 1B, the exposure system 100 according to this embodiment of the present disclosure includes: a first carrier 2 having a surface 21; a light source module 3 adjacent to the first carrier 2; a first moving device 4 disposed adjacent to the first carrier 2; a first shielding unit 41 disposed corresponding to the first moving device 4 (e.g., the first shielding unit 41 can be attached to or connected to the first moving device 4, however, is not limited to this arrangement) and disposed between the first carrier 2 and the light source module 3, wherein the first shielding unit 41 can be moved along a first direction (e.g., the X direction) by the first moving device 4; and a second moving device 1, on which the light source module 3 is provided so as to be moved along a second direction (e.g., the Y direction) by the second moving device 1, wherein the second direction (e.g., the Y direction) is perpendicular to the normal directions (e.g., the X direction and the −X direction) of the surface 21. Referring to FIG. 1C, which is a schematic top view of the exposure system 100 in FIG. 1B, the exposure system 100 further includes a reference plane 211, wherein the reference plane 211 is parallel to the surface 21 and has a normal direction. In the initial state, the first carrier 2 has a first projection T1 on the reference plane 211, and the light source module 3 has a second projection T2 on the reference plane 211, both projections being projected along the normal direction of the reference plane 211. The first projection T1 and the second projection T2 do not overlap in the initial state. In one embodiment, the initial state is a state in which the first projection T1 and the second projection T2 do not overlap, and the exposure state is a state in which the second projection T2 at least partially overlaps with the first projection T1 of the first carrier 2; the present disclosure, however, is not limited to this arrangement.

As shown in FIG. 1B, the exposure system 100 in this embodiment may further include: a second carrier 5 adjacent to the light source module 3, wherein the light source module 3 is disposed between the first carrier 2 and the second carrier 5 in the initial state; a third moving device 6 disposed adjacent to the second carrier 5; and a third shielding unit 61 disposed on the third moving device 6 and disposed between the second carrier 5 and the light source module 3. Referring again to FIG. 1C, which is a schematic top view of the exposure system 100 in FIG. 1B, the second carrier 5 has a third projection T3 on the reference plane 211, and the third projection T3 is also projected along the normal direction of the reference plane 211. The second projection T2 and the third projection T3 do not overlap in the initial state. In one embodiment, the initial state is a state in which the second projection T2 overlaps with neither the third projection T3 nor the first projection T1, but the present disclosure is not limited to this arrangement and only requires that the first projection T1 and the second projection T2 do not overlap in the initial state or that the second projection T2 and the third projection T3 do not overlap in the initial state.

Here, the light source module 3 includes a plurality of light tubes for emitting ultraviolet (UV) radiation or includes a plurality of light-emitting diode (LED) light sources 31 that have at least one main-peak wavelength ranging from 300 nm to 370 nm. In one embodiment, the LED light sources have a first main-peak wavelength ranging from 300 nm to 370 nm. In another embodiment, the LED light sources have a first main-peak wavelength and a second main-peak wavelength different from the first main-peak wavelength (e.g., the difference between the first and the second main-peak wavelengths being greater than 5 nm), but both the first main-peak wavelength and the second main-peak wavelength range from 300 nm to 370 nm.

Figure 5:
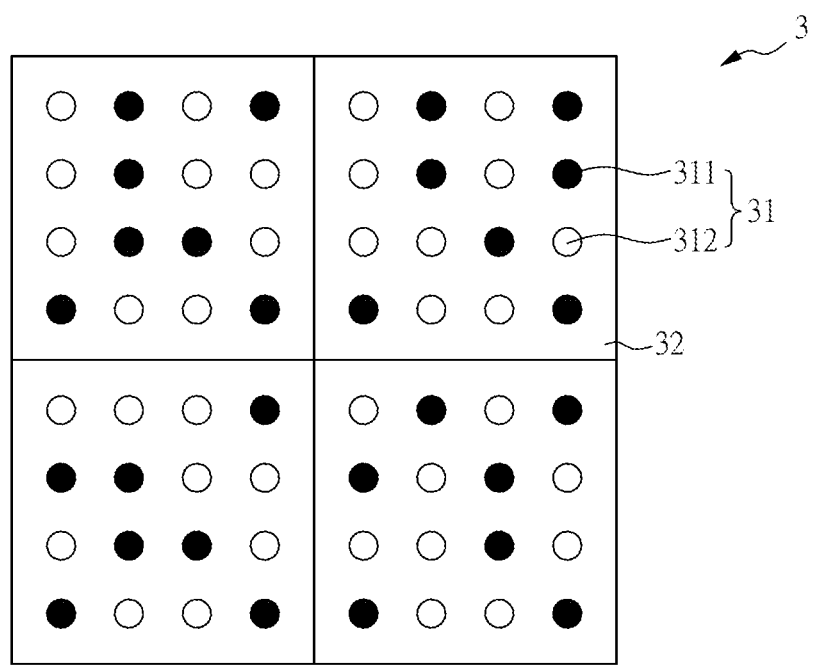

In some embodiments, referring to FIG. 5, the LED light sources 31 can be divided into a plurality of light-emitting regions 32 according to the provision of switches (e.g., thin-film transistor (TFT) devices, transistors, or the like, without limitation, provided that the switches can be used to turn on and off the light sources), and each light-emitting region 32 has a regional switch. Each regional switch can be used to turn on and off the LED light sources in the corresponding region so as to more precisely control the light projected on the first carrier 2 and the second carrier 5, thereby saving energy or reducing the difference in light reception between the carriers (i.e., the first carrier 2 and the second carrier 5). There is no special limitation on the time interval between turning on an LED light source and turning off the same LED light source (also referred to as the switching time). For example, a switching time may range from 0 to 1 second. In another embodiment, each light-emitting region 32 has a plurality of switches, in order for the light emitted by the LED light sources 31 to form a predetermined pattern of light to which a specific region of a substrate can be exposed without having to turn on all the LED light sources, thereby producing an energy-saving effect.

There is no special limitation on the material of the first shielding unit 41 or the material of the third shielding unit 61. The first shielding unit 41 and the third shielding unit 61 may be made of the same material or of different materials respectively, such as but not limited to metal plates. The shielding units can block the UV radiation emitted by the light source module 3, such as but not limited to UV radiation of wavelengths not longer than 400 nm. The first shielding unit 41 and the third shielding unit 61 are provided to enhance the display quality of display panels by reducing additional exposure to light that may result from an exceedingly short distance between the light source module 3 and each substrate carrier (i.e., the first carrier 2 or the second carrier 5).

Embodiment 2

Figure 2A:
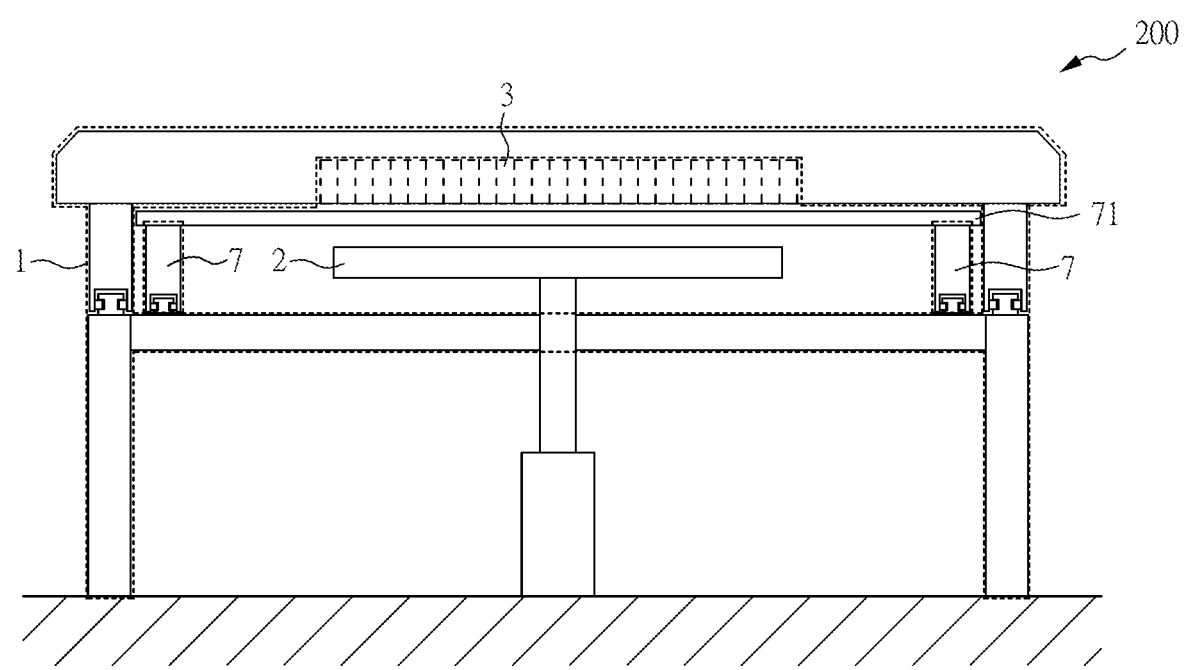
FIG. 2A and FIG. 2B are sectional views of two exposure systems according to the second embodiment of the present disclosure.

FIG. 2A shows a sectional view of an exposure system according to the second embodiment of the present disclosure. The exposure system 200 in FIG. 2A is similar to that in FIG. 1A except that the exposure system 200 in FIG. 2A further includes: a fourth moving device 7 corresponding to the second moving device 1 (in this embodiment, the fourth moving device 7 is disposed under the second moving device 1 in the initial state); and a second shielding unit 71 disposed on the fourth moving device 7 and disposed under the light source module 3. The second shielding unit 71 has a fourth projection (not shown) on the reference plane 211, wherein the fourth projection is also projected along the normal direction of the reference plane 211. The area of the second shielding unit 71 is larger than or equal to that the area of the light source module 3. More specifically, the area of the fourth projection is larger than or equal to the area of the second projection T2.

Here, the second shielding unit 71 is not subjected to any special limitation on material and may be made of a metal plate for example, provided that the second shielding unit 71 can block the UV radiation emitted by the light source module 3, such as but not limited to UV radiation whose wavelengths are not longer than 400 nm.

Figure 2B:
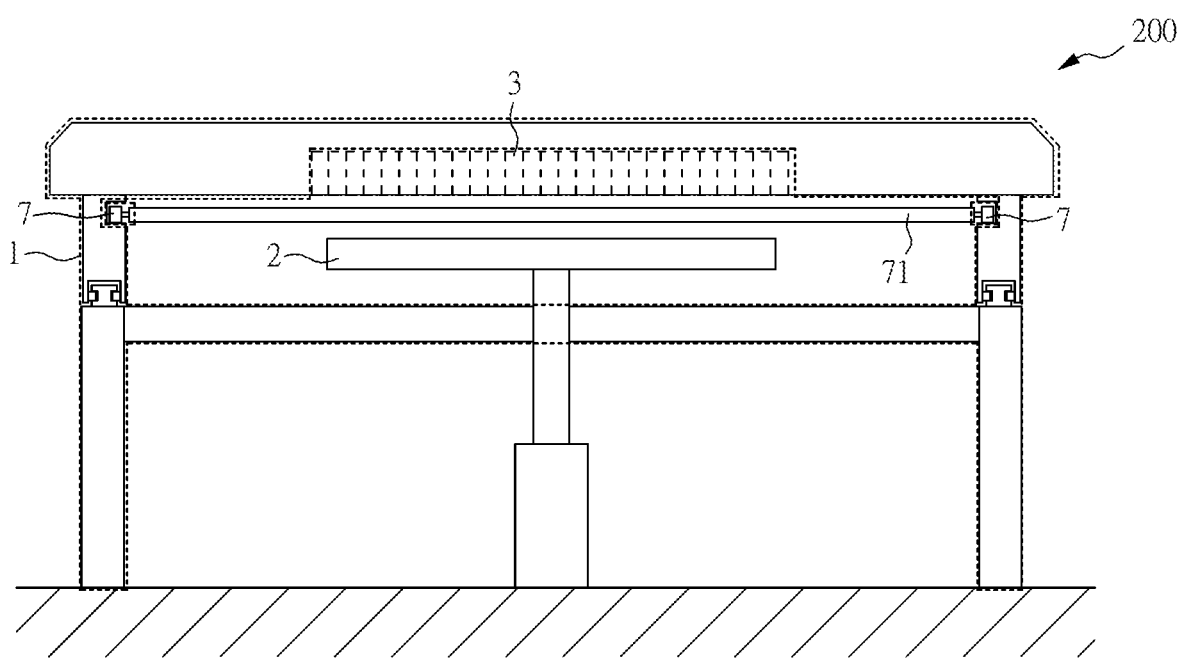

FIG. 2B shows a sectional view of another exposure system according to the second embodiment of the present disclosure. The exposure system 200 in FIG. 2B is similar to that in FIG. 2A except that the fourth moving device 7 and the second moving device 1 in the exposure system 200 in FIG. 2B are integrated to save space.

Here, the second shielding unit 71 is not subjected to any special limitation on material either and may be made of a metal plate for example, provided that the second shielding unit 71 can block the UV radiation emitted by the light source module 3, such as but not limited to UV radiation whose wavelengths are not longer than 400 nm.

Embodiment 3

FIG. 3A to FIG. 3D show the process flow of manufacturing a display panel according to the third embodiment of the present disclosure. To begin with, referring to FIG. 3A, a first substrate 8 and an exposure system 100 are provided. The exposure system 100 includes a light source module 3 and a first shielding unit 41. The first shielding unit 41 is disposed between the first substrate 8 and the light source module 3 in the initial state. Moreover, the first substrate 8 in the initial state is disposed at a first-substrate initial position P, and the light source module 3 in the initial state is disposed at a light-source-module initial position Q.

Then, referring to FIG. 3B and FIG. 3C, the first shielding unit 41 is moved along a first direction X, and the light source module 3 is subsequently moved to pass through the first shielding unit 41 along a second direction Y until the light source module 3 reaches a predetermined position above the first substrate 8 to subject the first substrate 8 to the light of the light source module 3. The first direction X and the second direction Y are different directions. Here, the first direction X refers to a direction perpendicular to the first substrate 8, and the second direction Y refers to a direction parallel to the first substrate 8. These two directions, however, are not necessarily so defined, provided that one is different from the other.

Once the first substrate 8 is sufficiently exposed to light, referring to FIG. 3D, the light source module 3 is moved back to the light-source-module initial position Q along the opposite direction of the second direction Y, and the first shielding unit 41 is subsequently moved back to its position between the first-substrate initial position P and the light-source-module initial position Q along the opposite direction of the first direction X, i.e., back to the initial state shown in FIG. 3A.

Figure 3A:
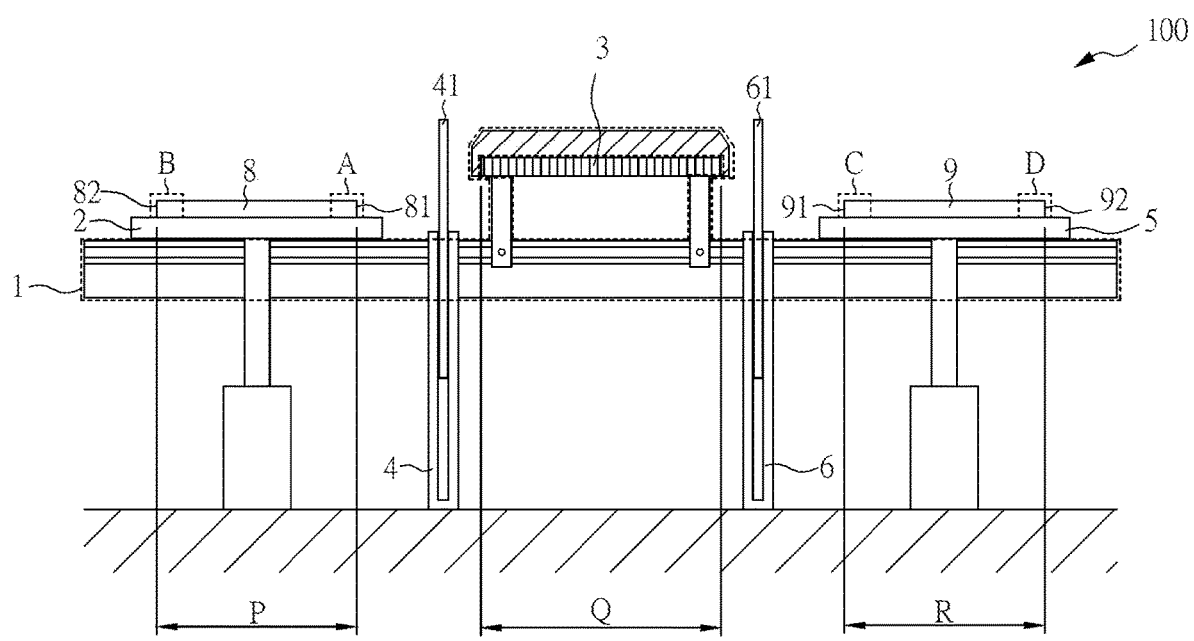
FIG. 3A to FIG. 3D show the process flow of manufacturing a display panel according to the third embodiment of the present disclosure.
Figure 3B:
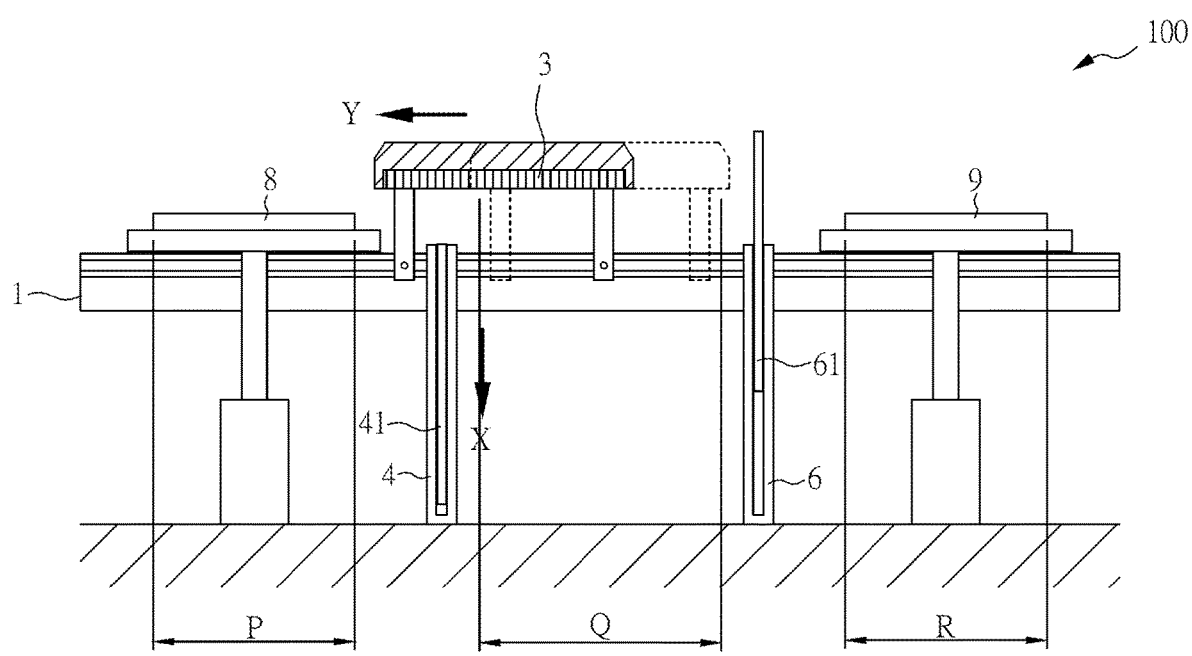
Figure 3C:
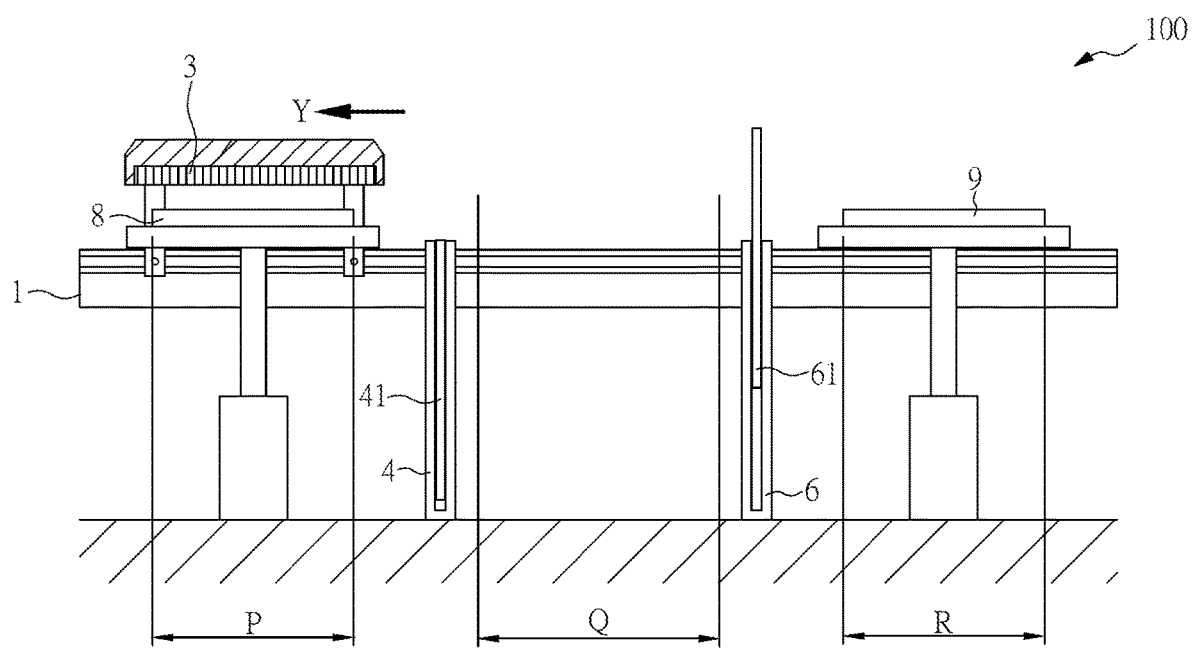
Figure 3D:
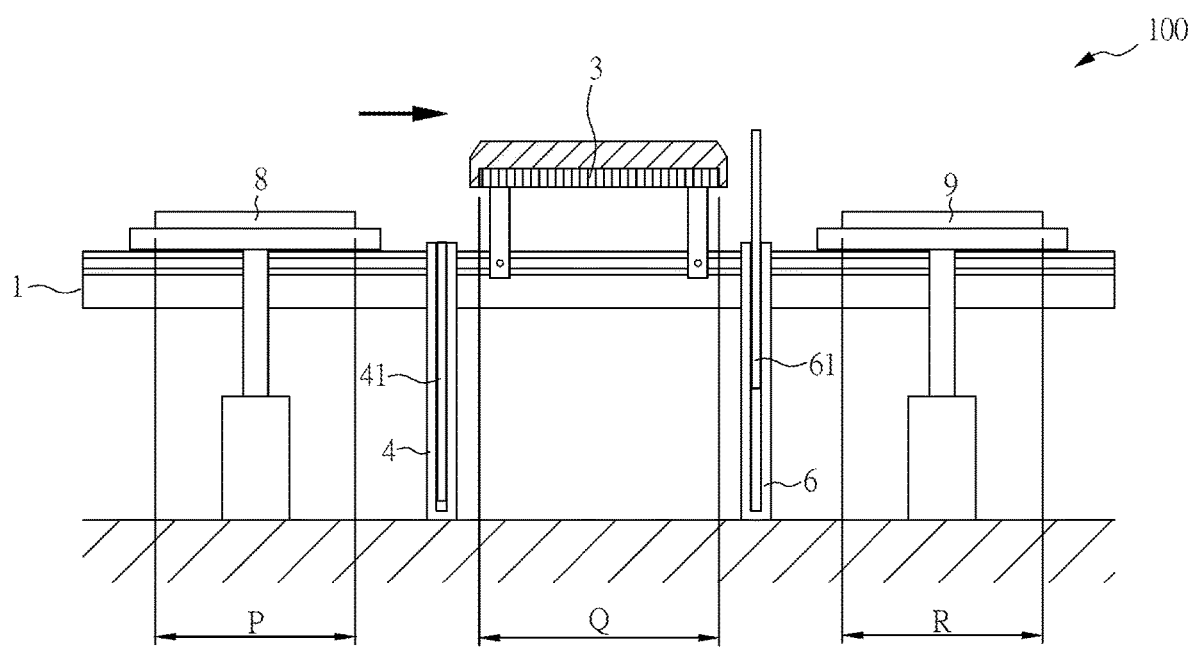

As shown in FIG. 3A, the first substrate 8 has a first edge 81 adjacent to the light source module 3 and a second edge 82 opposite to the first edge 81 and facing away from the light source module 3. Moreover, the first substrate 8 includes a first predetermined region A and a second predetermined region B. The first predetermined region A is defined as including the first edge 81 and a region extending as far as 50 mm from the first edge 81 toward the second edge 82. The second predetermined region B is defined as including the second edge 82 and a region extending as far as 50 mm from the second edge 82 toward the first edge 81. The difference in area between the first predetermined region A and the second predetermined region B is less than 10% of the first predetermined region A. For example, the difference in area between the first predetermined region A and the second predetermined region B is less than 1% of the first predetermined region A, or the first predetermined region A and the second predetermined region B have equal areas. The present disclosure, however, is not limited to the foregoing configurations with regard to area, provided that the first predetermined region A and the second predetermined region B have substantially equal areas. In an embodiment where light tubes capable of emitting UV radiation are used as the light sources, the light sources cannot be turned off immediately after (defined herein as less than 1 second after) they are turned on, the rationale behind this limitation being to maintain the radiation intensity of the light sources; in that case, it is imperative to provide the first shielding unit 41 between the light source module 3 and the first substrate 8 in order to reduce unnecessary interference with the first substrate 8 by the moving light source module 3.

Furthermore, if the light source module 3 is not turned off while moving, the first predetermined region A will be the first region to be exposed to light and the last region to stop receiving light during movement of the light source module 3 and end up exposed to more light than the second predetermined region B. To reduce uneven exposure of the first substrate 8 to light while the light source module 3 is moving, the light source module 3 in another embodiment uses LED light sources instead. As LED light sources are highly stable and can be turned on and off within 1 second, it is feasible not to turn on the LED switches until the light source module 3 has been moved to a predetermined position above the first substrate 8. Once sufficient exposure is achieved, it is also feasible to turn off the LED switches before the light source module 3 is moved. Thus, power consumption can be lowered, or the amount of light to which the first predetermined region A and the second predetermined region B are respectively exposed can be rendered equal to increase the display quality of the finished product.

To raise the utilization rate of the light source module 3, the method for manufacturing a display panel according to the third embodiment of the present disclosure further includes: providing a second substrate 9; disposing the second substrate 9 at a second-substrate initial position R in the initial state, with the light-source-module initial position Q lying between the first-substrate initial position P and the second-substrate initial position R; and providing the exposure system 100 with a third shielding unit 61, wherein the third shielding unit 61 is disposed at a position between the second-substrate initial position R and the light-source-module initial position Q. After the first substrate 8 is sufficiently exposed to the light of the light source module 3 and the first shielding unit 41 has returned to its position between the first-substrate initial position P and the light-source-module initial position Q (or when the light source module 3 starts to move along the opposite direction of the second direction Y), the method continues by: moving the third shielding unit 61 along the first direction X; moving (or continuing the movement of) the light source module 3 along the opposite direction of the second direction Y so that the light source module 3 moves to pass through the third shielding unit 61 and reaches a predetermined position above the second substrate 9 to subject the second substrate 9 to the light of the light source module 3; moving the light source module 3 back to the light-source-module initial position Q along the second direction Y; and moving the third shielding unit 61 back to the position between the second-substrate initial position R and the light-source-module initial position Q along the opposite direction of the first direction X, i.e., back to the initial state shown in FIG. 3A. It should be pointed out that the positions mentioned herein do not have fixed coordinates but are relative positions. In this embodiment for example, the light-source-module initial position Q is on the right-hand side of the first shielding unit 41 (or between the first shielding unit 41 and the third shielding unit 61 if the third shielding unit 61 exists), the first-substrate initial position P is on the left-hand side of the first shielding unit 41, the second-substrate initial position R is on the right-hand side of the third shielding unit 61.

As shown in FIG. 3A, the second substrate 9 has a third edge 91 adjacent to the light source module 3 and a fourth edge 92 opposite to the third edge 91 and facing away from the light source module 3. Moreover, the second substrate 9 includes a third predetermined region C and a fourth predetermined region D. The third predetermined region C is defined as including the third edge 91 and a region extending as far as 50 mm from the third edge 91 toward the fourth edge 92. The fourth predetermined region D is defined as including the fourth edge 92 and a region extending as far as 50 mm from the fourth edge 92 toward the third edge 91. The difference in area between the third predetermined region C and the fourth predetermined region D is less than 10% of the third predetermined region C. For example, the difference in area between the third predetermined region C and the fourth predetermined region D is less than 1% of the third predetermined region C, or the third predetermined region C and the fourth predetermined region D have equal areas. The present disclosure, however, is not limited to the foregoing configurations with regard to area, provided that the third predetermined region C and the fourth predetermined region D have substantially equal areas. In one embodiment of the present disclosure where LED light sources are used in the light source module 3, as the LED light sources are highly stable and can be turned on and off within 1 second, it feasible not to turn on the LED switches for light exposure until the light source module 3 has been moved to a predetermined position above the second substrate 9. Once sufficient exposure is achieved, it is also feasible to turn off the LED switches before the light source module 3 is moved. Thus, power consumption can be lowered, or the difference in the amount of light exposure between the third predetermined region C and the fourth predetermined region D can be reduced to increase the display quality of the finished product.

Here, the substrates 8 and 9 may be display panels, TFT substrates, or color filter (CF) substrates. Also, the substrates 8 and 9 may be pliable (flexible) or rigid (inflexible). The present disclosure imposes no limitation on the types of the substrates 8 and 9.

Referring to FIG. 5, the light source module 3 includes a plurality of LED light sources 31. In FIG. 5, which is a schematic drawing of the light source module 3 in certain embodiments of the present disclosure, the solid black dots 311 represent LED light sources that are emitting light, and the empty dots (circles) 312 represent LED light sources that are not emitting light. The LED light sources 31 have at least one main-peak wavelength ranging from 300 nm to 370 nm. In one embodiment, the LED light sources have a first main-peak wavelength ranging from 300 nm to 370 nm. In another embodiment, and by way of example only, the LED light sources have a first main-peak wavelength and a second main-peak wavelength, wherein the two main-peak wavelengths are different (e.g., with a difference in wavelength greater than 5 nm) but both range from 300 nm to 370 nm. However, the present disclosure is not limited thereto.

In some embodiments, the LED light sources 31 can be divided into a plurality of light-emitting regions 32 according to the provision of switches (e.g., TFT devices, transistors, or the like, without limitation, provided that the switches can be used to turn on and off the light sources), and each light-emitting region 32 has a regional switch. Each regional switch can be used to turn on and off the LED light sources in the corresponding region so as to more precisely control the light received by each substrate, thereby saving energy or reducing the difference in the amount of light exposure between the substrates. There is no special limitation on the time interval between turning on an LED light source and turning off the same LED light source (also referred to as the switching time). For example, a switching time may range from 0 to 1 second. In another embodiment, each light-emitting region 32 has a plurality of switches in order for the light emitted by the LED light sources 31 to form a predetermined pattern of light to which a specific region of a substrate can be exposed without having to turn on all the LED light sources, thereby producing an energy-saving effect.

There is no special limitation on the material of the first shielding unit 41 or the material of the third shielding unit 61. The first shielding unit 41 and the third shielding unit 61 may be made of the same material or of different materials respectively, such as but not limited to metal plates. The shielding units can block the UV radiation emitted by the light source module 3, such as but not limited to UV radiation of wavelengths not longer than 400 nm. In some other embodiments, the first shielding unit 41, the first moving device 4, the third shielding unit 61, and the third moving device 6 can be dispensed with if the LED light sources are properly designed to prevent excessive divergence of light.

Embodiment 4

Figure 4A:
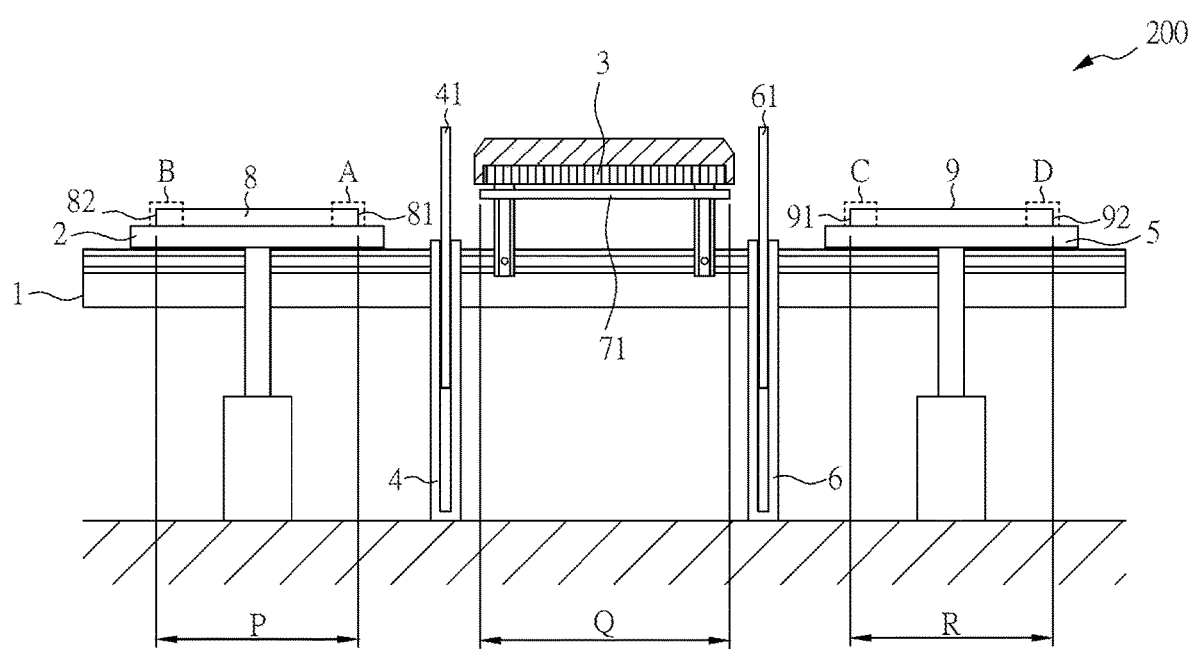
FIG. 4A to FIG. 4E show the process flow of manufacturing a display panel according to the fourth embodiment of the present disclosure.

FIG. 4A to FIG. 4E show the process flow of manufacturing a display panel according to the fourth embodiment of the present disclosure. Referring to FIG. 4A for another exposure system 200 according to the present disclosure, the exposure system 200 is different from the exposure system 100 in that the exposure system 200 further includes a second shielding unit 71. All the identical portions of the two systems will not be described repeatedly. The process flow begins by providing a first substrate 8 and an exposure system 200 as shown in FIG. 4A. The exposure system 200 includes a light source module 3, a first shielding unit 41, and a second shielding unit 71. In the initial state, the first substrate 8 is disposed at a first-substrate initial position P, the light source module 3 is disposed at a light-source-module initial position Q, the first shielding unit 41 is disposed between the first-substrate initial position P and the light-source-module initial position Q, and the second shielding unit 71 is disposed under the light source module 3. The area of the second shielding unit 71 is larger than or equal to that of the light source module 3. More specifically, the second shielding unit 71 has a fourth projection (not shown) on the reference plane 211, the fourth projection is projected along the normal direction of the reference plane 211, and the area of the fourth projection is larger than that of the second projection T2 (see FIG. 1C). The second shielding unit 71 has a larger area than the light source module 3 in order to provide better shielding effect. For example, the area of the second shielding unit 71 is 1-5 times as large as the area of the light source module 3 so that the second shielding unit 71 can block the light emitted by the light source module 3.

Figure 4B:
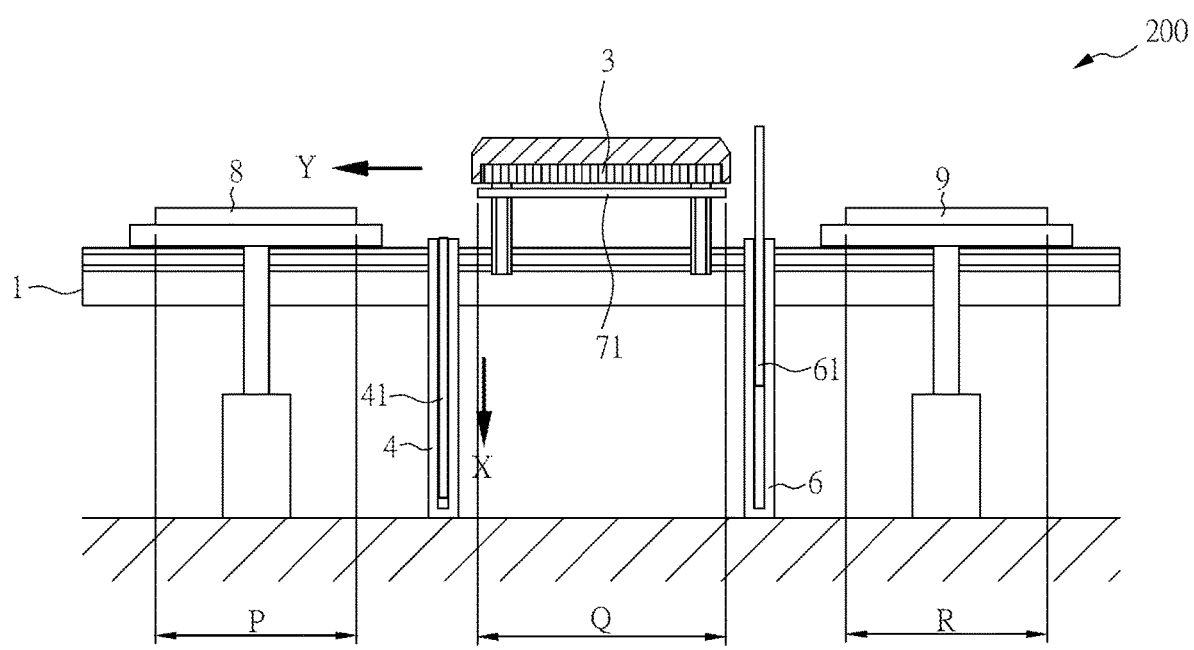
Figure 4C:
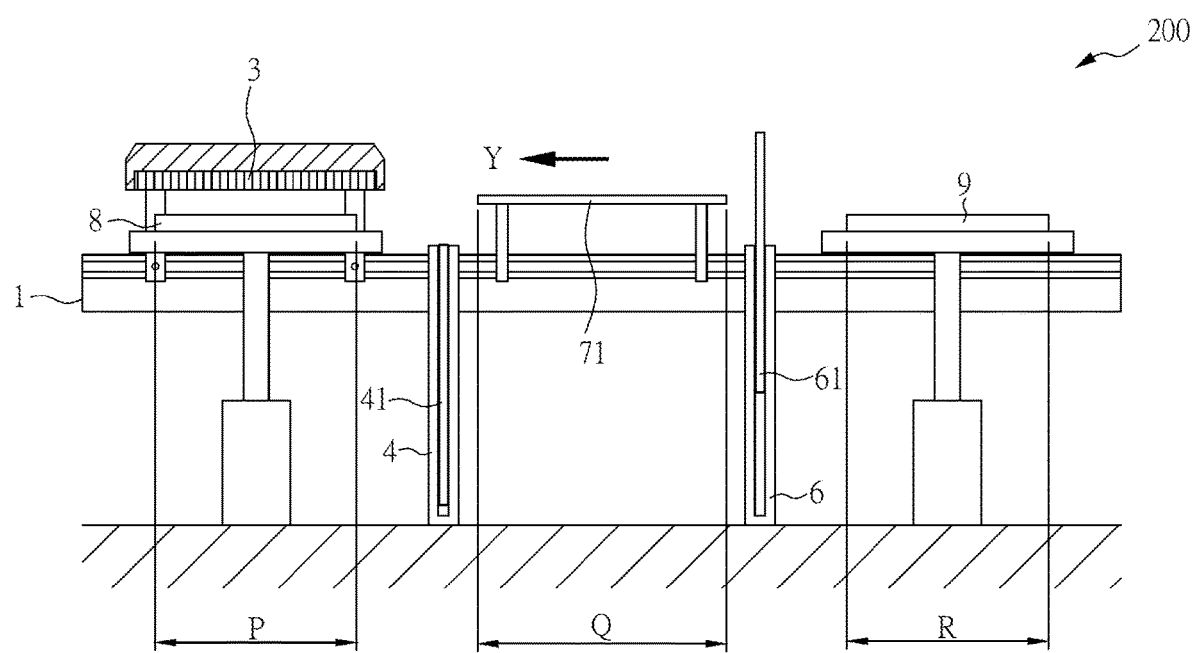

Then, referring to FIG. 4B and FIG. 4C, the first shielding unit 41 is moved along a first direction X, and the light source module 3 is subsequently moved to pass through the first shielding unit 41 along a second direction Y until the light source module 3 reaches a predetermined position above the first substrate 8 to subject the first substrate 8 to the light of the light source module 3. The first direction X and the second direction Y are different directions. Here, the first direction X refers to a direction perpendicular to the first substrate 8, and the second direction Y refers to a direction parallel to the first substrate 8. These two directions, however, are not necessarily so defined, provided that one is different from the other.

Figure 4D:
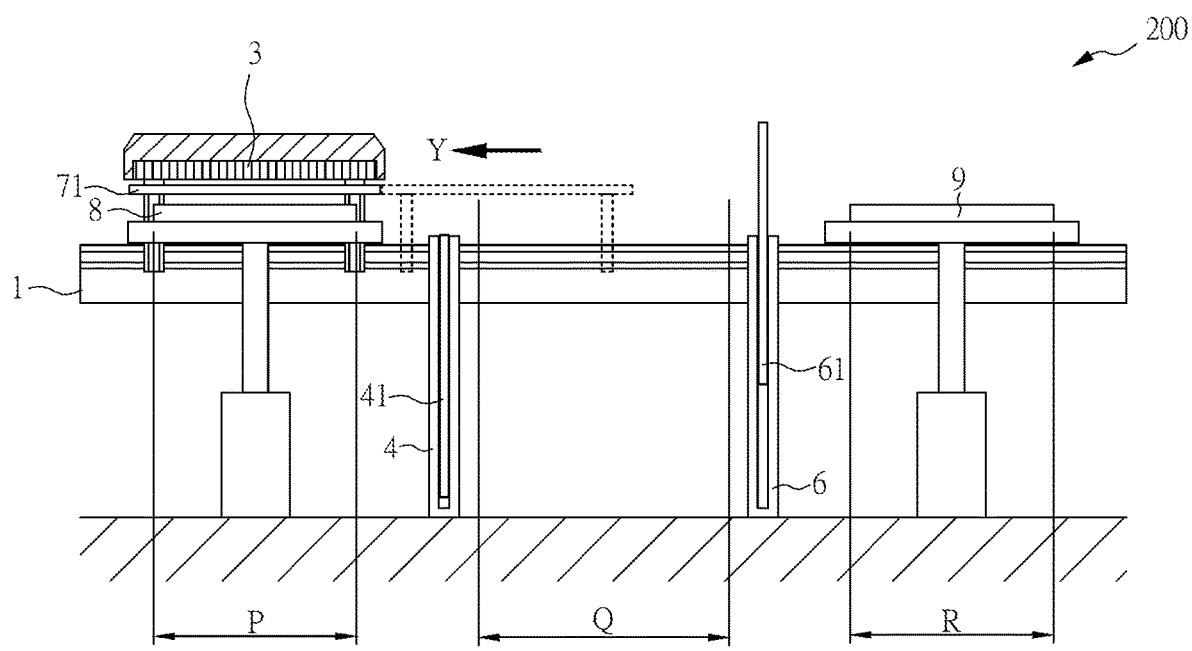

Once the first substrate 8 is sufficiently exposed to the light of the light source module 3, referring to FIG. 4D, the second shielding unit 71 is moved in the second direction Y to a predetermined position under the light source module 3 and between the first substrate 8 and the light source module 3. After that, referring to FIG. 4E, the light source module 3 and the second shielding unit 71 are simultaneously moved back to the light-source-module initial position Q at the same speed along the opposite direction of the second direction Y, i.e., back to the initial state shown in FIG. 4A.

Figure 6A:
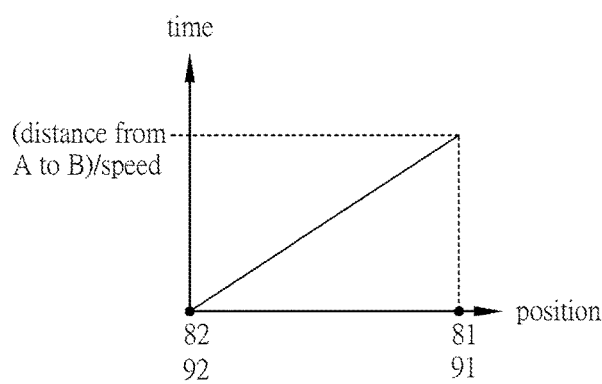
FIG. 6A and FIG. 6B are plots corresponding to the process flow in FIG. 4A to FIG. 4E, showing the total exposure period in relation to position.
Figure 6B:
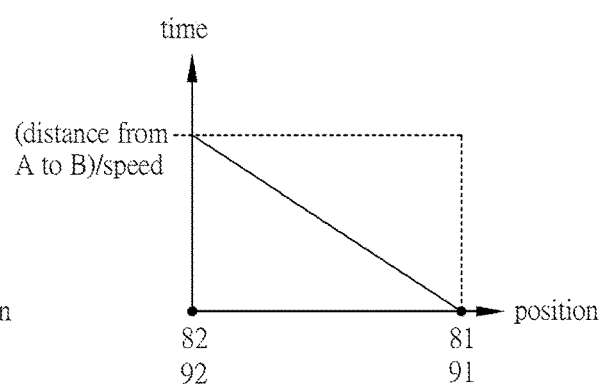

As shown in the sectional view of FIG. 4A, the first substrate 8 has a first edge 81 adjacent to the light source module 3 and a second edge 82 opposite to the first edge 81 and facing away from the light source module 3. Moreover, the first substrate 8 includes a first predetermined region A and a second predetermined region B. The first predetermined region A is defined as including the first edge 81 and a region extending as far as 50 mm from the first edge 81 toward the second edge 82. The second predetermined region B is defined as including the second edge 82 and a region extending as far as 50 mm from the second edge 82 toward the first edge 81. The difference in area between the first predetermined region A and the second predetermined region B is less than 10% of the first predetermined region A. For example, the difference in area between the first predetermined region A and the second predetermined region B is less than 1% of the first predetermined region A, or the first predetermined region A and the second predetermined region B have equal areas. The present disclosure, however, is not limited to the foregoing configurations with regard to area. FIG. 6A and FIG. 6B are plots corresponding to the process flow in FIG. 4A to FIG. 4E and show the differences in exposure period. Here, FIG. 6A shows the differences in exposure period during the steps of FIG. 4B and FIG. 4C. The vertical axis in FIG. 6A indicates the duration of exposure to light while the horizontal axis indicates position. In the course in which the light source module 3 is moved along the second direction Y to the predetermined position above the first substrate 8, the first edge 81 is exposed to light earlier than the second edge 82. The first substrate 8, therefore, has a first exposure period defined as the absolute value of the difference between the duration for which the second projection T2 overlaps with the projection of the first edge 81 on the reference plane 211 along the normal direction of the reference plane 211 and the duration for which the second projection T2 overlaps with the projection of the second edge 82 on the reference plane 211 along the normal direction of the reference plane 211 (the latter duration being set at 0 in the present disclosure). FIG. 6B, on the other hand, shows the differences in exposure period during the steps of FIG. 4C and FIG. 4D. Likewise, the vertical axis in FIG. 6B indicates the duration of exposure to light while the horizontal axis indicates position. In the course in which the second shielding unit 71 is moved along the second direction Y to the predetermined position above the first substrate 8, the first edge 81 is shielded by the second shielding unit 71 earlier than the second edge 82. The first substrate 8, therefore, has a first shielding period defined as the absolute value of the difference between the duration for which the projection of the second shielding unit 71 on the reference plane 211 along the normal direction of the reference plane 211 overlaps with the projection of the first edge 81 on the reference plane 211 along the normal direction of the reference plane 211 and the duration for which the projection of the second shielding unit 71 on the reference plane 211 along the normal direction of the reference plane 211 overlaps with the projection of the second edge 82 on the reference plane 211 along the normal direction of the reference plane 211 (the former duration defined as 0 in the present disclosure). The first exposure period and the first shielding period are equal, or have a difference less than 10% of the first exposure period, or have a difference less than 1% of the first exposure time, or have a difference between the first exposure period and the first shielding period is less than 10% of the first exposure period and more than or equal to zero, wherein the difference (%) is calculated as [|(first shielding period−first exposure period)|/first exposure period]×100%.

Figure 4E:
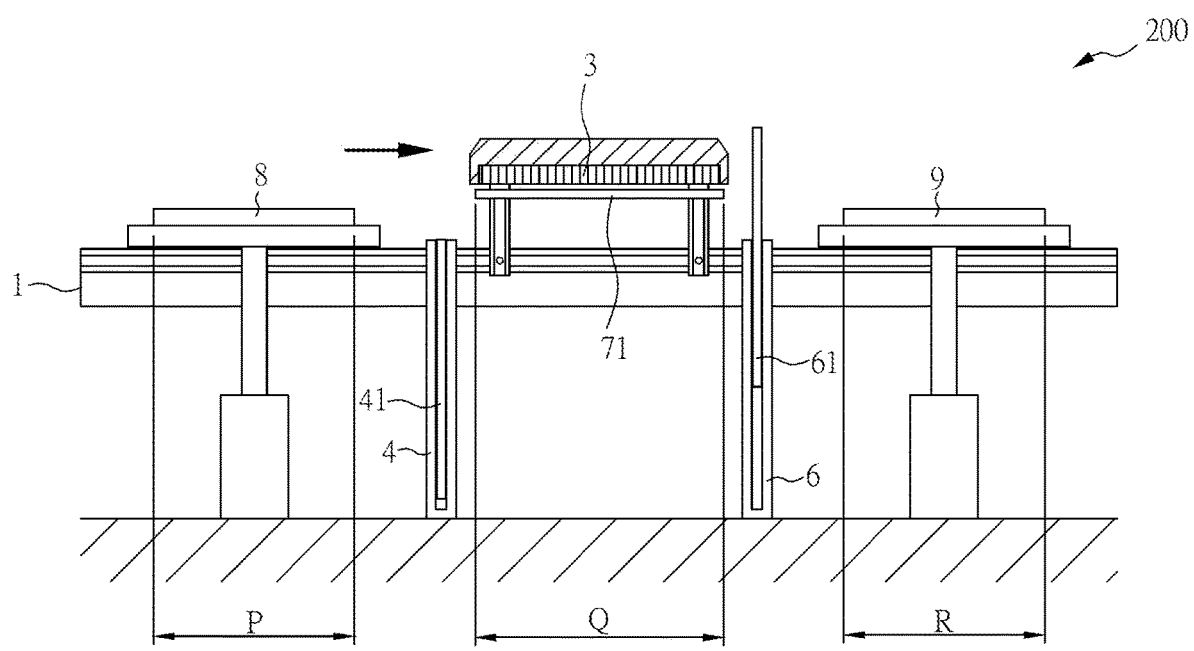

Referring to FIG. 4E, the process flow continues by moving the light source module 3 and the second shielding unit 71 together, and at the same speed, along the opposite direction of the second direction Y. As the area of the second shielding unit 71 is larger than or equal to that of the light source module 3, and the second shielding unit 71 is withdrawn together with the light source module 3 (or at the same speed as the light source module 3, but not necessarily so, provided that the first edge 81 and the second edge 82 are kept from additional exposure to light), the first edge 81 and the second edge 82 will not be exposed to more light than intended.

According to the above, the exposure period and shielding period (respectively corresponding to the light source module 3 and the second shielding unit 71) of the first edge 81 and of the second edge 82 can be made close to each other so that, if the light source module 3 and the second shielding unit 71 are moved along the second direction Y at the same speed and with the same acceleration, the total amount of light to which the first predetermined region A is exposed will be equal to that of the second predetermined region B (or the total exposure period of the first predetermined region A will be equal to that of the second predetermined region B), thereby enhancing the display quality of the finished product. In one embodiment of the present disclosure, the light source module 3 and the second shielding unit 71 are rendered into the same moving state (in terms of speed, acceleration, moving path, and so on), but this is not essential to the present disclosure, as long as the difference in the amount of light exposure (or in the total exposure period) between the first predetermined region A and the second predetermined region B caused by the movement of the light source module 3 and that caused by the movement of the second shielding unit 71 can generally cancel each other. However, the present disclosure is not limited thereto.

To raise the utilization rate of the light source module 3, the method for manufacturing a display panel according to the fourth embodiment of the present disclosure further includes: providing the exposure system 200 with a second substrate 9; disposing the second substrate 9 at a second-substrate initial position R in the initial state, with the light-source-module initial position Q lying between the first-substrate initial position P and the second-substrate initial position R; and providing the exposure system 200 with a third shielding unit 61, wherein the third shielding unit 61 is disposed at a position between the second-substrate initial position R and the light-source-module initial position Q. After the first substrate 8 is sufficiently exposed to the light of the light source module 3 and the first shielding unit 41 has returned to its position between the first-substrate initial position P and the light-source-module initial position Q (or when the light source module 3 starts to move along the opposite direction of the second direction Y), the method continues by: moving the third shielding unit 61 along the first direction X; moving (or continuing the movement of) the light source module 3 along the opposite direction of the second direction Y so that the light source module 3 moves to pass through the third shielding unit 61 and reaches a predetermined position above the second substrate 9 to subject the second substrate 9 to the light of the light source module 3; moving the second shielding unit 71 along the opposite direction of the second direction Y to a predetermined position above the second substrate 9 and between the second substrate 9 and the light source module 3 after the second substrate 9 is sufficiently exposed to the light of the light source module 3; moving the light source module 3 together with the second shielding unit 71 back to the light-source-module initial position Q along the second direction Y; and moving the third shielding unit 61 back to the position between the second-substrate initial position R and the light-source-module initial position Q along the opposite direction of the first direction X, i.e., back to the initial state shown in FIG. 4A.

The second substrate 9 has a third edge 91 adjacent to the light source module 3 and a fourth edge 92 opposite to the third edge 91 and facing away from the light source module 3. Moreover, the second substrate 9 includes a third predetermined region C and a fourth predetermined region D. The third predetermined region C is defined as including the third edge 91 and a region extending as far as 50 mm from the third edge 91 toward the fourth edge 92. The fourth predetermined region D is defined as including the fourth edge 92 and a region extending as far as 50 mm from the fourth edge 92 toward the third edge 91. The difference in area between the third predetermined region C and the fourth predetermined region D is less than 10% of the third predetermined region C. For example, the difference in area between the third predetermined region C and the fourth predetermined region D is less than 1% of the third predetermined region C, or the third predetermined region C and the fourth predetermined region D have equal areas. The present disclosure, however, is not limited to the foregoing configurations with regard to area, provided that the third predetermined region C and the fourth predetermined region D have substantially equal areas. Please refer again to FIG. 6A and FIG. 6B for plots showing the differences in exposure period in this embodiment of the present disclosure. Here, FIG. 6A shows the differences in exposure period caused by the light source module 3 to the second substrate 9. The vertical axis in FIG. 6A indicates the duration of exposure to light while the horizontal axis indicates position. In the course in which the light source module 3 is moved along the opposite direction of the second direction Y to the predetermined position above the second substrate 9, the third edge 91 is exposed to light earlier than the fourth edge 92. The second substrate 9, therefore, has a second exposure period defined as the absolute value of the difference between the duration for which the second projection T2 overlaps with the projection of the third edge 91 on the reference plane 211 along the normal direction of the reference plane 211 and the duration for which the second projection T2 overlaps with the projection of the fourth edge 92 on the reference plane 211 along the normal direction of the reference plane 211 (the latter duration being set at 0 in the present disclosure). FIG. 6B, on the other hand, shows the differences in exposure period caused by the second shielding unit 71 to the second substrate 9. Likewise, the vertical axis in FIG. 6B indicates the duration of exposure to light while the horizontal axis indicates position. In the course in which the second shielding unit 71 is moved along the opposite direction of the second direction Y, in the same way as the light source module 3 was, to the predetermined position above the second substrate 9, the third edge 91 is shielded by the second shielding unit 71 earlier than the fourth edge 92. The second substrate 9, therefore, has a second shielding period defined as the absolute value of the difference between the duration for which the projection of the second shielding unit 71 on the reference plane 211 along the normal direction of the reference plane 211 overlaps with the projection of the third edge 91 on the reference plane 211 along the normal direction of the reference plane 211 and the duration for which the projection of the second shielding unit 71 on the reference plane 211 along the normal direction of the reference plane 211 overlaps with the projection of the fourth edge 92 on the reference plane 211 along the normal direction of the reference plane 211 (the former duration defined as 0 in the present disclosure). The second exposure period and the second shielding period are equal, or have a difference less than 10% of the second exposure period, or have a difference less than 1% of the second exposure period, wherein the difference (%) is calculated as [|(second shielding period−second exposure period)|/second exposure period]×100%. Then, the process flow continues by moving the light source module 3 and the second shielding unit 71 together, and in the same way, along the second direction Y. As the area of the second shielding unit 71 is larger than or equal to that the area of the light source module 3, and the second shielding unit 71 is withdrawn together with the light source module 3 (or at the same speed as the light source module 3, but not necessarily so, provided that the third edge 91 and the fourth edge 92 are kept from additional exposure to light), the third edge 91 and the fourth edge 92 will not be exposed to more light than intended.

According to the above, the exposure period and shielding period (attributable respectively to the light source module 3 and the second shielding unit 71) of the third edge 91 and of the fourth edge 92 can be made close to each other so that, if the light source module 3 and the second shielding unit 71 are moved along the opposite direction of the second direction Y at the same speed and with the same acceleration, the total amount of light to which the third predetermined region C is exposed will be equal to that of the fourth predetermined region D (or the total exposure period of the third predetermined region C will be equal to that of the fourth predetermined region D), thereby enhancing the display quality of the finished product. In one embodiment of the present disclosure, the light source module 3 and the second shielding unit 71 are rendered into the same moving state (in terms of speed, acceleration, moving paths, and so on), but this is not essential to the present disclosure, as long as the difference in the amount of light exposure (or in the total exposure period) between the third predetermined region C and the fourth predetermined region D caused by the movement of the light source module 3 and that caused by the movement of the second shielding unit 71 can generally cancel each other. For example, the difference in the total amount of light exposure (or in the total exposure period) between the third predetermined region C and the fourth predetermined region D is less than 10%, 5%, or 1% of the total amount of light exposure (or the total exposure period) of the third predetermined region C. However, the present disclosure is not limited thereto.

It is worth mentioning that the first moving device 4, the first shielding unit 41, the third moving device 6, and the third shielding unit 61 in this embodiment can be dispensed with if the second shielding unit 71 is large enough to block the light emitted laterally from the light source module 3.

Here, the substrates 8 and 9 may be display panels, TFT substrates, or CF substrates. Also, the substrates 8 and 9 may be pliable (flexible) or rigid (inflexible). The present disclosure imposes no limitation on the types of the substrates 8 and 9. Moreover, the light source module 3 may include a plurality of light tubes capable of emitting UV radiation or a plurality of LED light sources 31.

There is no special limitation on the material of the first shielding unit 41, the material of the second shielding unit 71, or the material of the third shielding unit 61. The first shielding unit 41, the second shielding unit 71, and the third shielding unit 61 may be made of the same material or of different materials respectively, such as but not limited to metal plates. The shielding units can block the UV radiation emitted by the light source module 3, such as but not limited to UV radiation of wavelengths not longer than 400 nm.

To sum up, the present disclosure uses a specially designed exposure system and a method for manufacturing a display panel using the same to reduce uneven light exposure of two opposite edge regions of a substrate, thereby enhancing the display quality of the resulting display panel.

The embodiments described above should be construed as explanatory only and are by no means restrictive of the scope of the present disclosure.

What is claimed is:

1. A method for manufacturing a display panel, comprising the steps of:
    providing a first substrate and an exposure system, wherein the exposure system comprises a light source module and a first shielding unit;
    disposing the first shielding unit at a position between the first substrate and the light source module in an initial state;
    moving the first shielding unit along a first direction;
    moving the light source module to pass through the first shielding unit along a second direction different from the first direction, and exposing the first substrate to a light emitted by the light source module;
    moving the light source module along an opposite direction of the second direction; and
    moving the first shielding unit back to the position between the first substrate and the light source module along an opposite direction of the first direction.

2. The method for manufacturing the display panel of claim 1, wherein the exposure system further comprises a second shielding unit, the second shielding unit is disposed under the light source module in the initial state, and an area of the second shielding unit is larger than or equal to an area of the light source module.

3. The method for manufacturing the display panel of claim 2, further comprising the step, to be performed after exposing the first substrate to the light emitted by the light source module, of moving the second shielding unit along the second direction to a position under the light source module and between the first substrate and the light source module.

4. The method for manufacturing the display panel of claim 3, further comprising the step, to be performed while moving the light source module along the opposite direction of the second direction, of moving the second shielding unit simultaneously along the opposite direction of the second direction.

5. The method for manufacturing the display panel of claim 3, wherein the first substrate has a first exposure period while the light source module being moved along the second direction, the first substrate further has a first shielding period while the second shielding unit being moved along the second direction, and a different between the first exposure period and the first shielding period is less than 10% of the first exposure period and more than or equal to zero.

6. The method for manufacturing the display panel of claim 1, wherein a second substrate is further provided, the light source module is disposed between the first substrate and the second substrate in the initial state, the exposure system further comprises a third shielding unit disposed at a position between the second substrate and the light source module, and the method further comprises the steps, to be performed after moving the first shielding unit back to the position between the first substrate and the light source module, of:
    moving the third shielding unit along the first direction;
    moving the light source module to pass through the third shielding unit along the opposite direction of the second direction, and exposing the second substrate to the light emitted by the light source module;
    moving the light source module along the second direction; and
    moving the third shielding unit back to the position between the second substrate and the light source module along the opposite direction of the first direction.

7. The method for manufacturing the display panel of claim 6, wherein the exposure system further comprises a second shielding unit, the second shielding unit is disposed under the light source module in the initial state, and an area of the second shielding unit is larger than or equal to an area of the light source module.

8. The method for manufacturing the display panel of claim 7, further comprising the step, to be performed after exposing the first substrate to the light emitted by the light source module, of moving the second shielding unit along the second direction to a position under the light source module and between the first substrate and the light source module; and the step, to be performed after exposing the second substrate to the light emitted by the light source module, of moving the second shielding unit along the opposite direction of the second direction to a position under the light source module and between the second substrate and the light source module.

9. The method for manufacturing the display panel of claim 8, wherein the first substrate has a first exposure period while the light source module being moved along the second direction, and the first substrate further has a first shielding period while the second shielding unit being moved along the second direction, the first exposure period and the first shielding period have a difference less than 10% of the first exposure period; the second substrate has a second exposure period while the light source module being moved along the opposite direction of the second direction, and the second substrate further has a second shielding period while the second shielding unit being moved along the opposite direction of the second direction, and the second exposure period and the second shielding period have a difference less than 10% of the second exposure period.

10. An exposure system, comprising:
a first carrier having a surface, wherein a reference plane is parallel to the surface and has a normal direction;
a light source module adjacent to the first carrier; and
a first shielding unit disposed between the first carrier and the light source module;
wherein in an initial state, the first carrier has a first projection on the reference plane along the normal direction of the reference plane, the light source module has a second projection on the reference plane along the normal direction of the reference plane, and the first projection and the second projection do not overlap.

11. The exposure system of claim 10, wherein the exposure system further comprises a first moving device disposed adjacent to the first carrier, and the first shielding unit is disposed corresponding to the first moving device.

12. The exposure system of claim 11, wherein the exposure system further comprises a second moving device, and the light source module is disposed on the second moving device, wherein the first shielding unit is moved along a first direction by the first moving device, the light source module is moved along a second direction, and the first direction is different from the second direction.

13. The exposure system of claim 10, wherein the exposure system further comprises a second shielding unit, the second shielding unit is disposed under the light source module in the initial state, and an area of the second shielding unit is larger than or equal to an area of the light source module.

14. The exposure system of claim 13, wherein the exposure system further comprises a fourth moving device, and the second shielding unit is disposed on the fourth moving device.

15. The exposure system of claim 13, wherein the exposure system further comprises a second moving device and a fourth moving device, the light source module is disposed on the second moving device; and, the second shielding unit is disposed on the fourth moving device, and the second moving device and the fourth moving device are integrated.

16. The exposure system of claim 10, wherein the exposure system further comprises a second carrier and a third shielding unit, the light source module is disposed between the first carrier and the second carrier in the initial state, and the third shielding unit is disposed between the second carrier and the light source module.

17. The exposure system of claim 16, wherein the second carrier has a third projection on the reference plane along the normal direction of the reference plane, and the second projection and the third projection do not overlap in the initial state.

18. The exposure system of claim 10, wherein in an exposure state, the first projection at least partially overlaps with the second projection.

19. The exposure system of claim 10, wherein the light source module have at least one main-peak wavelength ranging from 300 nm to 370 nm.

20. The exposure system of claim 10, wherein the light sources have a first main-peak wavelength and a second main-peak wavelength;
wherein the first main-peak wavelength is different from the second main-peak wavelength.

* * * * *